United States Patent
Kobayashi

(10) Patent No.: US 10,805,126 B2
(45) Date of Patent: Oct. 13, 2020

(54) DATA GENERATION CIRCUIT AND TRANSMISSION DEVICE

(71) Applicant: Toshiba Memory Corporation, Minato-ku (JP)

(72) Inventor: Hiroyuki Kobayashi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/553,239

(22) Filed: Aug. 28, 2019

(65) Prior Publication Data

US 2020/0295976 A1  Sep. 17, 2020

(30) Foreign Application Priority Data

Mar. 14, 2019  (JP) .................................. 2019-047088

(51) Int. Cl.
*H04L 25/03* (2006.01)
*H03K 19/20* (2006.01)

(52) U.S. Cl.
CPC .. *H04L 25/03343* (2013.01); *H04L 25/03038* (2013.01); *H03K 19/20* (2013.01)

(58) Field of Classification Search
CPC ......... H04L 25/03057; H04L 25/03343; H04L 25/03038; H03K 19/20
See application file for complete search history.

(56) References Cited

U.S. PATENT DOCUMENTS

| | | | |
|---|---|---|---|
| 6,563,858 B1 | 5/2003 | Fakatselis et al. | |
| 6,603,801 B1 | 8/2003 | Andren et al. | |
| 6,678,310 B1 | 1/2004 | Andren et al. | |
| 8,494,377 B1* | 7/2013 | Cirit .................. | H04B 10/2507 398/155 |
| 9,379,920 B1 | 6/2016 | Liao et al. | |
| 9,537,682 B2 | 1/2017 | Venkatram et al. | |
| 2017/0003344 A1* | 1/2017 | Uekusa ............ | G01R 31/31723 |

FOREIGN PATENT DOCUMENTS

| | | |
|---|---|---|
| JP | 2004-500725 A | 1/2004 |
| JP | 2018-516469 A | 6/2018 |
| JP | 2018-520545 A | 7/2018 |

* cited by examiner

*Primary Examiner* — Sung S Ahn
(74) *Attorney, Agent, or Firm* — Oblon, McClelland, Maier & Neustadt, L.L.P.

(57) ABSTRACT

According to one embodiment, a data generation circuit includes a storing circuit, and first and second selection circuits. The storing circuit is configured to store different data items and output the data items in different phases in response to clock signals. The first selection circuit is configured to select first data items one by one from the data items output from the storing circuit and output a first series of selected data items. The second selection circuit is configured to select second data items one by one, whose phase are different from the selected first data items, from the data items output from the storing circuit and output a second series of selected data items.

18 Claims, 5 Drawing Sheets

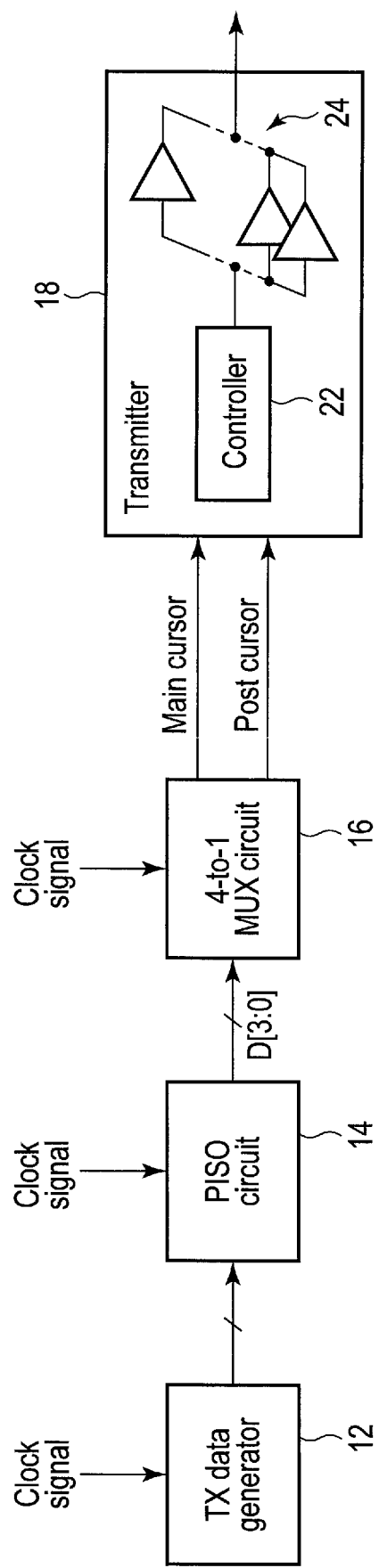
F I G. 1

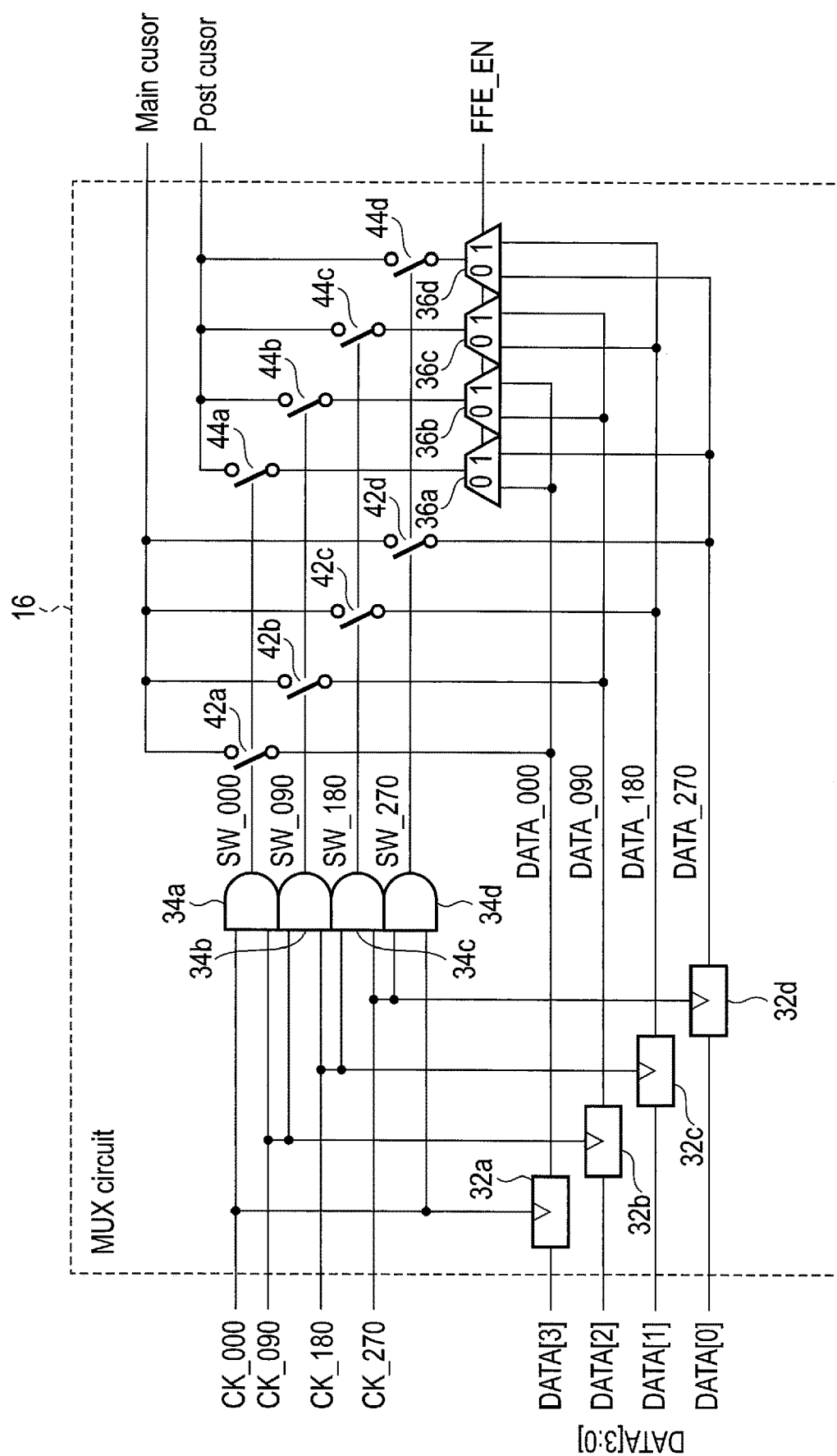
F I G. 2

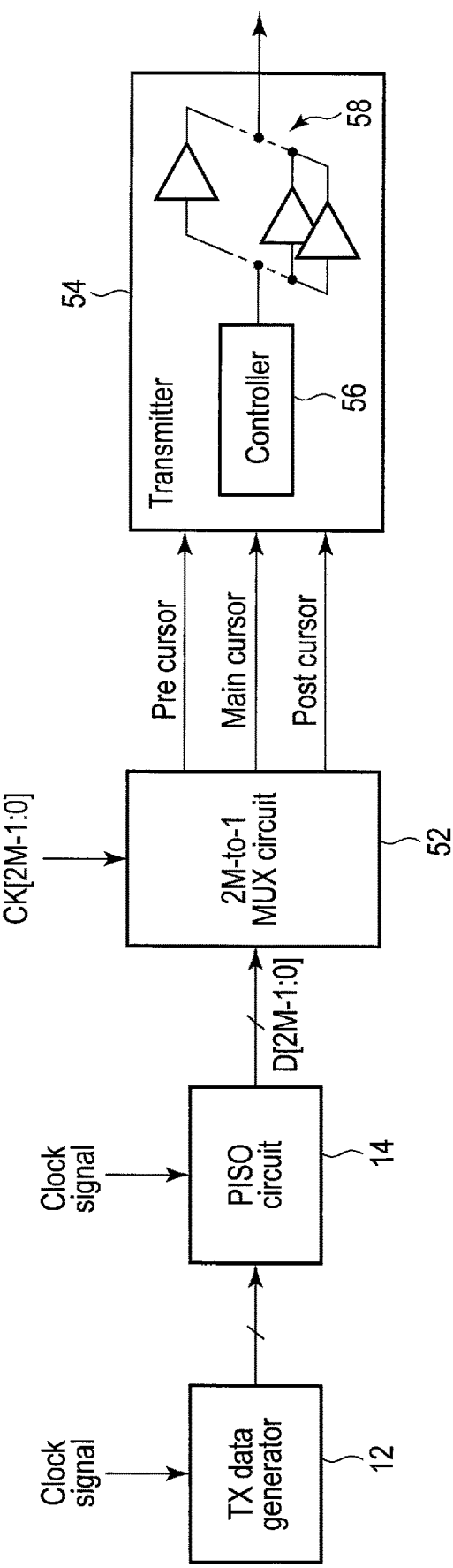
F I G. 4

DATA GENERATION CIRCUIT AND TRANSMISSION DEVICE

CROSS-REFERENCE TO RELATED APPLICATIONS

This application is based upon and claims the benefit of priority from Japanese Patent Application No. 2019-047088, filed Mar. 14, 2019, the entire contents of which are incorporated herein by reference.

FIELD

Embodiments described herein relate generally to a data generation circuit and a transmission device.

BACKGROUND

High-speed serial interfaces such as PCI Express (registered trademark) (also referred to as PCIe (registered trademark)) and Serial Advanced Technology Attachment (SATA) (registered trademark) have been developed.

A transmission device converts a parallel signal into a serial signal to generate a high-frequency serial signal. When the transmission frequency becomes a high frequency that cannot be processed by parallel/serial conversion, the high frequency is realized using a multiplexor (MUX) circuit (also referred to as a 2-to-1 MUX circuit) which receives two serial input signals, and selects to output the input signals alternately.

As the transmission frequency increases, the amplitude of a signal that is being transmitted, especially the amplitude of the high-frequency components of the signal is likely to attenuate and the waveform of the signal is likely to deteriorate. Thus, the transmission device may include a feedforward equalizer (referred to as FFE hereinafter) that compensates in advance for the deterioration of the waveform of a signal that is being transmitted. The FFE amplifies the amplitude of data that is being transmitted. It depends upon transmitted data how much the data is amplified. Using data transmitted at a point in time (referred to as a main cursor), the amplitude of data transmitted before and after the point in time is controlled. Controlling the amplitude of data transmitted before the point in time using the main cursor will be referred to as a pre-cursor FFE. Controlling the amplitude of data transmitted after the point in time using the main cursor will be referred to as a post cursor FFE. The FFE therefore necessitates a data generation circuit that generates the post cursor for the post cursor FFE and the pre-cursor for the pre-cursor FFE in addition to the main cursor.

If the transmission frequency increases further, the 2-to-1 MUX circuit can be replaced with another MUX circuit (also referred to as a 4-to-1 MUX circuit). The 4-to-1 MUX circuit receives four serial input signals, and selects to output the input signals in sequence. Since, however, the 4-to-1 MUX circuit includes twice as many pre-stage signal lines as the 2-to-1 MUX circuit, the data generation circuit increases in size and so does the power consumption.

BRIEF DESCRIPTION OF THE DRAWINGS

FIG. 1 is a block diagram showing an example of a configuration of a transmission device including a data generation circuit according to a first embodiment.

FIG. 2 is a diagram showing a specific example of a circuit arrangement of a 4-to-1 MUX circuit in the first embodiment.

FIG. 4 is a block diagram showing an example of a configuration of a transmission device including a data generation circuit according to a second embodiment.

DETAILED DESCRIPTION

Figure 3:
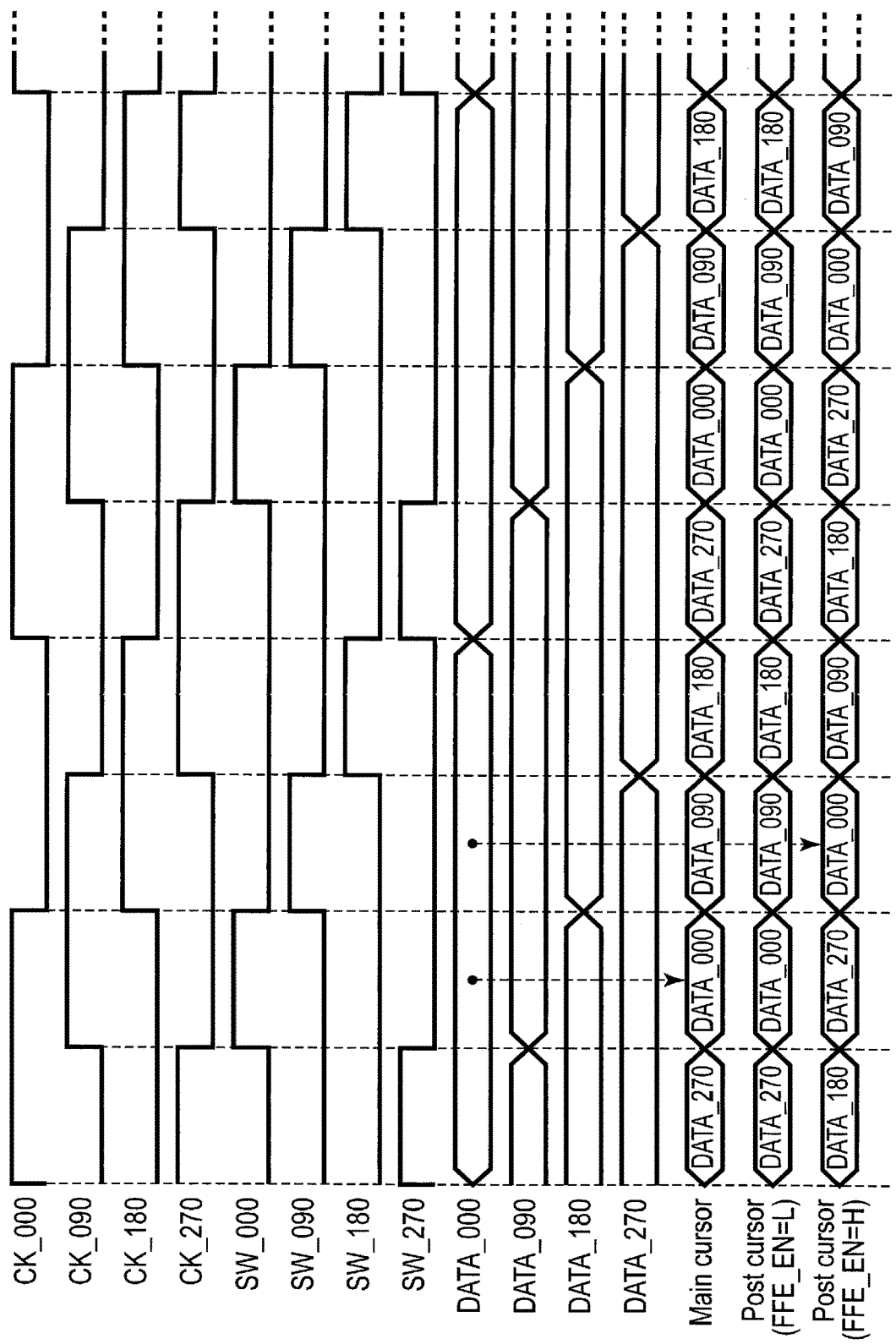
FIG. 3 is a chart showing an example of signal waveforms of the 4-to-1 MUX circuit in the first embodiment.

Embodiments will be described below with reference to the drawings. In the following description, a device and a method are illustrated to embody the technical concept of the embodiments, and the technical concept is not limited to the configuration, shape, arrangement, material, etc., of the structural elements described below. Modifications that could easily be conceived by a person with ordinary skill in the art are naturally included in the scope of the disclosure. To make the description clearer, the drawings may schematically show the size, thickness, planer dimension, shape, etc., of each element differently from those in the actual aspect. The drawings may include elements that differ in dimension and ratio. Elements corresponding to each other in the drawings are denoted by the same reference numeral and the overlapping descriptions may be omitted. Some elements may be denoted by different names, and these names are merely an example. It should not be denied that one element is denoted by different names. Note that "connected" in the following description means that one element is connected to another element via still another element as well as that one element is directly connected to another element.

In general, according to one embodiment, a data generation circuit comprises a storing circuit, a first selection circuit, and a second selection circuit. The storing circuit is configured to store different data items and output the data items in different phases in response to clock signals whose phases are shifted. The first selection circuit is configured to select first data items one by one at different timings from the data items output from the storing circuit and output a first series of selected first data items. The second selection circuit is configured to select second data items one by one, whose phase are different from the selected first data items, at different timings from the data items output from the storing circuit and output a second series of selected second data items.

First Embodiment

FIG. 1 is a block diagram showing an example of a configuration of a transmission device including a data generation circuit according to a first embodiment.

A transmission data (also referred to as TX data) generator 12 generates transmission data (parallel data) of a plurality of bits corresponding to information to be transmitted, and outputs the transmission data in parallel in synchronization with a clock signal. There are various modulation schemes of transmission data. Assume here that, for example, a non-return-to-zero (NRZ) modulation scheme is employed. Furthermore, for example, the transmission data generator 12 outputs a 16-bit transmission data in parallel in synchronization with a 1-GHz clock signal. Note that the transmission data modulation scheme, a frequency of the clock signal, and the number of bits of the transmission data are only one example and may have any other values.

A parallel-in-serial-out (PISO) circuit 14 up-converts the transmission data to a high frequency very close to the transmission frequency. Note that an output of the PISO circuit 14 may be either serial data or parallel data. Assume here that the PISO circuit 14 outputs parallel data. For example, the PISO circuit 14 converts 16-bit parallel data into 4-bit parallel data based on a 4-GHz clock signal. Accordingly, 1-Gbps parallel data is converted into 4-Gbps parallel data and its modulation rate is quadrupled.

The 4-bit transmission data D[3:0] output from the PISO circuit 14 is supplied to a 4-to-1 MUX circuit 16. For example, the 4-to-1 MUX circuit 16 is supplied with the 4-GHz 4-phase clock signals. The 4-to-1 MUX circuit 16 selects one of four input data items (4-bit parallel data) in sequence in response to the clock signals and outputs one transmission data item (1-bit serial data). The 4-to-1 MUX circuit 16 thus quadruples a modulation rate of the transmission data. The 1-bit transmission data item output from the 4-to-1 MUX circuit 16 is the main cursor for an FFE. The 4-to-1 MUX circuit 16 also outputs the post cursor, the details of which will be described later.

The main cursor and post cursor output from the 4-to-1 MUX circuit 16 are supplied to a transmitter 18. For example, the transmitter 18 includes a controller 22 and a driver 24. The driver 24 includes a plurality of (e.g., eight) source-series terminated (SST) drivers connected in parallel. In the SST driver, for example, a resistor is connected between a connection of two-stage NMOS transistors and an output of the two-stage NMOS transistors. The controller 22 is able to control the amplitude of transmission data that is the main cursor by driving some of the SST drivers negatively and driving the other SST drivers positively. The controller 22 determines the number of SST drivers to be driven negatively, based upon data of the post cursor, and controls the driver 24. Thus, the post cursor FFE is achieved. The output of the driver 24 is output in serial to a transmission path as transmission data.

The post cursor FFE drives some of the SST drivers negatively to control the amplitude of the transmission data. Therefore, the controller 22 includes an inverter. The inverter inverts data of the post cursor. The controller 22 drives the some of the SST drivers in response to the inverted signal of the data of the post cursor. However, instead of the controller 22, the 4-to-1 MUX circuit 16 may include an inverter to generate the post cursor whose polarity is inverted.

FIG. 2 is a circuit diagram showing an example of the 4-to-1 MUX circuit 16. FIG. 3 is a chart showing an example of signal waveforms of the 4-to-1 MUX circuit 16 shown in FIG. 2. The 4-to-1 MUX circuit 16 receives four transmission data items and four clock signals, and stores values of the four transmission data items over one period of each of the four clock signals. The phases of the four clock signals are shifted from one another. The 4-to-1 MUX circuit 16 selects and outputs one of the four transmission data items in response to four switching signals. The four switching signals are generated from any two of the four clock signals and the phases of the four switching signals are shifted. Accordingly, the modulation rate of the transmission data is quadrupled. Since the 4-to-1 MUX circuit 16 stores the four transmission data items, it can select some of the stored transmission data items in response to two switching signals whose phases are shifted and output the main cursor and post cursor. The two switching signals have only to be continuous (i.e., when the generation of one switching signal stops, that of the other switching signal has only to start), and their timings (i.e., the phase of a selected one of the stored transmission data items) can optionally be set.

In the example shown in FIG. 3, the clock signal includes four clock signals CK_000, CK_090, CK_180, and CK_270 whose phases are shifted from one another. The phase of the clock signal CK_090 is delayed by 90 degrees than that of the clock signal CK_000. The phase of the clock signal CK_180 is delayed by 90 degrees than that of the clock signal CK_090. The phase of the clock signal CK_270 is delayed by 90 degrees than that of the clock signal CK_180. The phase of the clock signal CK_000 is delayed by 90 degrees than that of the clock signal CK_270.

The clock signals CK_000 and CK_090 are input to an AND gate 34*a*. The AND gate 34*a* outputs a switching signal SW_000. The level of the switching signal SW_000 is "1" during the period in which the clock signals CK_000 and CK_090 are both at "1" level. The clock signals CK_090 and CK_180 are input to an AND gate 34*b*. The AND gate 34*b* outputs a switching signal SW_090. The level of the switching signal SW_090 is "1" during the period in which the clock signals CK_090 and CK_180 are both at "1" level. The clock signals CK_180 and CK_270 are input to an AND gate 34*c*. The AND gate 34*c* outputs a switching signal SW_180. The level of the switching signal SW_180 is "1" during the period in which the clock signals CK_180 and CK_270 are both at "1" level. The clock signals CK_270 and CK_000 are input to an AND gate 34*d*. The AND gate 34*d* outputs a switching signal SW_270. The level of the switching signal SW_270 is "1" during the period in which the clock signals CK_270 and CK_000 are both at "1" level.

Therefore, the "1" level switching signals SW_270, SW_000, SW_090, and SW_180 are output at different timings in this order, for example, in one cycle of the clock signal CK_000. The "1" level switching signals SW_000, SW_090, SW_180, and SW_270 are output at different timings in this order, for example, in one cycle of the clock signal CK_090. The "1" level switching signals SW_090, SW_180, SW_270, and SW_000 are output at different timings in this order, for example, in one cycle of the clock signal CK_180. The "1" level switching signals SW_180, SW_270, SW_000, and SW_090 are output at different timings in this order, for example, in one cycle of the clock signal CK_270.

DATA[3] of bit 3, DATA[2] of bit 2, DATA[1] of bit 1, and DATA[0] of bit 0 of transmission data D[3:0] are input to their respective flip-flops 32*a*, 32*b*, 32*c*, and 32*d*. The clock signals CK_000, CK_090, CK_180, and CK_270 are input to their respective clock signal terminals of the flip-flops 32*a*, 32*b*, 32*c*, and 32*d*. Values of DATA[3] of bit 3, DATA[2] of bit 2, DATA[1] of bit 1, and DATA[0] of bit 0 are fetched into the flip-flops 32*a*, 32*b*, 32*c*, and 32*d* with the rise of the clock signals CK_000, CK_090, CK_180, and CK_270, respectively.

Therefore, the values of transmission data DATA_000, DATA_090, DATA_180, and DATA_270 whose phases are shifted from one another are output from their respective flip-flops 32*a*, 32*b*, 32*c*, and 32*d*. The flip-flop 32*a* outputs the values of transmission data DATA_000 in synchronization with the rise of the clock signal CK_000. Similarly, the flip-flops 32*b*, 32*c*, and 32*d* output the values of transmission data DATA_090, DATA_180, and DATA_270 in synchronization with the rise of the clock signals CK_090, CK_180, and CK_270, respectively. The transmission data DATA_000 corresponds to the DATA[3] of bit 3 of the transmission data D[3:0]. The transmission data DATA_090 corresponds to the DATA[2] of bit 2 of the transmission DATA D[3:0]. The transmission data DATA_180 corresponds to the DATA[1] of bit 1 of the transmission DATA D[3:0]. The transmission DATA_270 corresponds to the DATA[0] of bit 0 of the transmission DATA D[3:0]. The phase of the transmission data DATA_090 is delayed by 90 degrees than that of the transmission data DATA_000. The phase of the transmission data DATA_180 is delayed by 90 degrees than that of the transmission data DATA_090. The phase of the transmission data DATA_270 is delayed by 90 degrees than that of the transmission data DATA_180. The phase of the transmission data DATA_000 is delayed by 90 degrees than that of the transmission data DATA_270.

The transmission data DATA_000, DATA_090, DATA_180, and DATA_270 are supplied as the main cursor to the transmitter 18 from the MUX circuit 16 via switches 42a, 42b, 42c, and 42d, respectively. The switches 42a, 42b, 42c, and 42d are respectively turned on during the periods in which the switching signals SW_000, SW_090, SW_180, and SW_270 are at "1" levels to output transmission data DATA_000, DATA_090, DATA_180, or DATA_270 from the 4-to-1 MUX circuit 16. The switching signals SW_000, SW_090, SW_180, and SW_270 are output at different timings. The switches 42a, 42b, 42c, and 42d are respectively turned off during the periods in which the switching signals SW_000, SW_090, SW_180, and SW_270 are at "0" levels to prevent transmission data DATA_000, data_090, DATA_180, and DATA_270 from being output from the 4-to-1 MUX circuit 16.

Therefore, the switches 42d, 42a, 42b, and 42c are turned on at different timings in this order, for example, in one cycle of the clock signal CK_000, transmission data DATA_270, DATA_000, DATA_090, and DATA_180 are output at different timings in sequence from the 4-to-1 MUX circuit 16. The switches 42a, 42b, 42c, and 42d are turned on at different timings in this order; for example, in one cycle of the clock signal CK_090, and transmission data DATA_000, DATA_090, DATA_180, and DATA_270 are output at different timings in sequence from the 4-to-1 MUX circuit 16. The switches 42b, 42c, 42d, and 42a are turned on at different timings in this order; for example, in one cycle of the clock signal CK_180, and transmission data DATA_090, DATA_180, DATA_270, and DATA_000 are output at different timings in sequence from the 4-to-1 MUX circuit 16. The switches 42c, 42d, 42a, and 42b are turned on at different timings in this order, for example, in one cycle of the clock signal CK_270, transmission data DATA_180, DATA_270, DATA_000, and DATA_090 are output at different timings in sequence from the 4-to-1 from the MUX circuit 16.

The data output via the switches 42a, 42b, 42c, and 42d are supplied to the transmitter 18 as a series of transmission data items and processed as the main cursor by the transmitter 18.

The transmission data DATA_000 is also input to a first input terminal (also referred to as "0" terminal) of a multiplexer 36a and a second input terminal (also referred to as "1" terminal) of a multiplexer 36b. The transmission data DATA_090 is also input to a first input terminal (also referred to as "0" terminal) of the multiplexer 36b and a second input terminal (also referred to as "1" terminal) of a multiplexer 36c. The transmission data DATA_180 is also input to a first input terminal (also referred to as "0" terminal) of the multiplexer 36c and a second input terminal (also referred to as "1" terminal) of a multiplexer 36d. The transmission data DATA_270 is also input to a first input terminal (also referred to as "0" terminal) of a multiplexer 36d and a second input terminal (also referred to as "1" terminal) of the multiplexer 36a.

The multiplexers 36a, 36b, 36c, and 36d each include a control terminal that is supplied with an FFE enable signal FFE_EN. When the FFE enable signal FFE_EN is at "0" level, the multiplexers 36a, 36b, 36c, and 36d select and output a signal of the first input terminal ("0" terminal). When the FFE enable signal FFE_EN is at "1" level, they select and output a signal of the second input terminal ("1" terminal).

The data output from the multiplexers 36a, 36b, 36c, and 36d are supplied to the transmitter 18 via switches 44a, 44b, 44c, and 44d respectively as a series of transmission data items processed as the post cursor by the transmitter 18. The switches 44a, 44b, 44c, and 44d are respectively turned on during the periods in which the switching signals SW_000, SW_090, SW_180, and SW_270 are at "1" levels to output signals of the multiplexers 36a, 36b, 36c, and 36d from the 4-to-1 MUX circuit 16. The signals are output at different timings. The switches 44a, 44b, 44c, and 44d are respectively turned off during the periods in which the switching signals SW_000, SW_090, SW_180, and SW_270 are at "0" levels to prevent the signals of the multiplexers 36a, 36b, 36c, and 36d from being output from the 4-to-1 MUX circuit 16.

Therefore, for example, in one cycle of the clock signal CK_000, when the switches 44d, 44a, 44b, and 44c are turned on at different timings in this order and the FFE enable signal FFE_EN is at "1" level, transmission data DATA_180, DATA_270, DATA_000, and DATA_090 are output at different timings in sequence from the 4-to-1 MUX circuit 16. When the FFE enable signal FFE_EN is at "1" level, the data output via the switches 44d, 44a, 44b, and 44c is supplied to the transmitter 18 as a series of transmission data. The phase of the series of transmission data output via the switches 44d, 44a, 44b, and 44c is delayed by 90 degrees than that of the series of transmission data output via the switches 42d, 42a, 42b, and 42c. Thus, the series of transmission data output via the switches 44d, 44a, 44b, and 44c is processed as the post cursor by the transmitter 18.

For example, in one cycle of the clock signal CK_000, when the switches 44d, 44a, 44b, and 44c are turned on at different timings in this order and the FFE enable signal FFE_EN is at "0" level, transmission data DATA_270, DATA_000, DATA_090, and DATA_180 are output at different timings in sequence from the 4-to-1 MUX circuit 16. When the FFE enable signal FFE_EN is at "0" level, the series of transmission data output via the switches 44d, 44a, 44b, and 44c is the same as the main cursor.

For example, in one cycle of the clock signal CK_090, when the switches 44a, 44b, 44c, and 44d are turned on at different timings in this order and the FFE enable signal FFE_EN is at "1" level, transmission data DATA_270, DATA_000, DATA_090, and DATA_180 are output at different timings in sequence from the 4-to-1 MUX circuit 16. For example, in one cycle of the clock signal CK_180, when the switches 44b, 44c, 44d, and 44a are turned on at different timings in this order and the FFE enable signal FFE_EN is at "1" level, transmission data DATA_000, DATA_090, DATA_180, and DATA_270 are output at different timings in sequence from the 4-to-1 MUX circuit 16. For example, in one cycle of the clock signal CK_270, when the switches 44c, 44d, 44a, and 44b are turned on at different timings in this order and the FFE enable signal FFE_EN is at "1" level, transmission data DATA_090, DATA_180, DATA_270, and DATA_000 are output at different timings in sequence from the 4-to-1 MUX circuit 16.

In the 4-to-1 MUX circuit 16 according to the first embodiment, the flip-flops 32a, 32b, 32c, and 32d store the values of transmission data DATA[3], DATA[2], DATA [1], and DATA[0], respectively. The flip-flops 32a, 32b, 32c, and 32d respectively fetch the values of transmission data DATA [3], DATA[2], DATA[1], and DATA[0] at different timings in synchronization with the rise of four clock signals CK_000, CK_090, CK_180, and CK_270. The flip-flops 32a, 32b, 32c, and 32d respectively output the values of one-cycle-previous transmission data DATA_000, DATA_090, DATA_180, and DATA_270 that have been stored, at different timings.

The phases of the four clock signals CK_000, CK_090, CK_180, and CK_270 are shifted from one another. The flip-flop 32a, 32b, 32c, and 32d respectively store the values of transmission data DATA[3], DATA[2], DATA[1], and DATA[0] for one cycle of the clock signals CK_000, CK_090, CK_180, and CK_270. The flip-flop 32a, 32b, 32c, and 32d respectively output the values of transmission data DATA_000, DATA_090, DATA_180, and DATA_270 for one cycle of the clock signals CK_000, CK_090, CK_180, and CK_270, which are output at different timings.

As described above, the 4-to-1 MUX circuit 16 according to the first embodiment includes:

four flip-flops 32a, 32b, 32c, and 32d which store values of four different data items and output the four different data items in different phases in response to four clock signals whose phases are shifted;

switches 42a, 42b, 42c, and 42d which select values of first data items one by one at different timings from the four data items output from the flip-flops 32a, 32b, 32c, and 32d and output a first series of data including the selected first data items; and multiplexers 36a, 36b, 36c, and 36d and switches 44a, 44b, 44c, and 44d which select second data items whose phase is different from that of the first data items selected by the switches 42a, 42b, 42c, and 42d one by one at different timings from the four data items output from the flip-flops 32a, 32b, 32c, and 32d, and output a second series of data including the selected second data items.

Therefore, the data items output from the switches 44a, 44b, 44c, and 44d are delayed by 90 degrees than the data items output from the switches 42a, 42b, 42c, and 42d, respectively. The data items output from the switches 42a, 42b, 42c, and 42d are the main cursor and the data items output from the switches 44a, 44b, 44c, and 44d are the post cursor.

The 4-to-1 MUX circuit 16 according to the first embodiment is able to quadruple the modulation rate of transmission data and generate the main cursor and post cursor for an FFE. Thus, there is no need to add a circuit for generating the main cursor and post cursor in a stage precedent to the 4-to-1 MUX circuit 16. It is therefore possible to suppress an increase in power consumption due to the high frequency of transfer data.

The 4-to-1 MUX circuit 16 according to the first embodiment also controls the multiplexers 36a, 36b, 36c, and 36d based on the level of the FFE enable signal FFE_FN to output the post cursor or main cursor therefrom. That is, the multiplexers 36a, 36b, 36c, and 36d can easily turn on or turn off the function of the FFE. If the turn-on or turn-off is performed by selecting a signal path using a selection switch provided separately, a difference in transmission time caused by the selection of the signal path deteriorates the output waveform, and the selection of the signal path is a factor to increase the jitters.

Note that the angle of the phase shift of the clock signals or switching signals is not limited to the example described above, but any other angles may be set.

Second Embodiment

Since the 4-to-1 MUX circuit 16 according to the first embodiment selects data in response to four clock signals of different phases, it can output four transmission data series in one cycle of the clock signal and generate the pre-cursor, too without being limited to the main cursor or the post cursor.

However, the values of transmission data DATA_000, DATA_090, DATA_180, and DATA_270 output from the flip-flops 32a, 32b, 32c, and 32d and transmission data DATA_270, DATA_000, DATA_090, and DATA_180 output from the multiplexers 36a, 36b, 36c, and 36d may not be stable near the start and end of one cycle. Thus, the 4-to-1 MUX circuit 16 according to the first embodiment generates a series of data items containing two data items selected near the center of each cycle as the main cursor and post cursor. If the number of input signals increases, the same MUX circuit as that of the first embodiment can generate the pre-cursor whose phase advances from that of the main cursor in addition to the main cursor and post cursor.

Below is a description of a second embodiment in which the number of input signals of an MUX circuit is 2M (M is a positive integer of three or more). FIG. 4 is a block diagram showing an example of a configuration of a transmission device including a data generation circuit according to the second embodiment. In the same manner as the first embodiment, the transmission data generator 12 generates transmission data of a plurality of bits corresponding to information to be transmitted, and outputs the transmission data in parallel in synchronization with the clock signal. There are various modulation schemes of transmission signals. Assume here that, for example, a non-return-to-zero (NRZ) modulation scheme is employed.

The transmission data is up-converted by the PISO circuit 14. The PISO circuit 14 outputs 2M-bit transmission data D[2M−1:0] in parallel.

The 2M-bit transmission data D[2M−1:0] output from the PISO circuit 14 is supplied to a 2M-to-1 MUX circuit 52. The 2M-to-1 MUX circuit 52 is supplied with 2M clock signals CK[2M−1:0]. The phase of two of the 2M clock signals are shifted by 360/2M degrees. The 2M-to-1 MUX circuit 52 selects the 2M-bit parallel transmission data in sequence in response to the phase-shifted 2M clock signals and outputs 1-bit transmission data. Thus, the 2M-to-1 MUX circuit 52 can increase the modulation rate of the transmission data 2M times. The 1-bit transmission data that is output from the 2M-to-1 MUX circuit 52 is the main cursor. The 2M-to-1 MUX circuit 52 also outputs the post cursor and pre-cursor, the details of which will be described later.

The main cursor, post cursor, and pre-cursor output from the 2M-to-1 MUX circuit 52 are supplied to the transmitter 54. The transmitter 54 includes a controller 56 and a driver 58. The driver 58 includes a plurality of (e.g., eight) SST drivers connected in parallel. The controller 56 determines the number of SST drivers operated negatively based upon data of the post cursor and data of the pre-cursor to control the driver 58. The driver 58 outputs signals in serial to the transmission path as transmission data.

The 2M-to-1 MUX circuit 52 is configured in the same manner as the 4-to-1 MUX circuit 16 shown in FIG. 2. For example, the 2M-to-1 MUX circuit 52 includes 2M AND gates (which are equivalent to the AND gates 34a, 34b, 34c, and 34d of the first embodiment) which are supplied with two clock signals selected from among the clock signals CK[2M−1:0]. One input terminal of each of the 2M AND gates is supplied with clock signals CK[2M−1], CK[2M−2], . . . CK[1], CK[0], and the other input terminal thereof is supplied with clock signals CK[M], CK[M−1], . . . CK[0], CK[2M−1], CK[2M−2], . . . CK[M+1]. The 2M AND gates output switching signals SW[2M−1:0] whose phases are shifted.

The 2M-to-1 MUX circuit 52 further includes: 2M flip-flops (which are equivalent to the flip-flops 32a, 32b, 32c, and 32d of the first embodiment) which store the values of 2M transmission data[2M−1:0] and output the 2M transmission data[2M−1:0] in different phases in response to 2M clock signals whose phases are shifted;

2M first switches (which are equivalent to the switches 42a, 42b, 42c, and 42d) which select first data items one by one at different timings from a plurality of data items D[2M−1:0] that is output from the 2M flip-flops during the periods in which the switching signals SW[2M−1:0] that is output from the AND gates are at "1" levels and output a first series of the selected first data items;

2M first multiplexers (which are equivalent to the multiplexers 36a, 36b, 36c, and 36d of the first embodiment) which select second data items whose phases are different from those of the first data items, one by one at different timings from the plurality of data items D[2M−1:0] that is output from two of the 2M flip-flops during a period in which the FFE enable signal is at "1" level;

2M second switches (which are equivalent to the switches 44a, 44b, 44c, and 44d) which output a second series of data items that is output from the 2M first multiplexers during the periods in which the switching signals SW[2M−1:0] that is output from the AND gates are at "1" levels;

2M second multiplexers (which are equivalent to the multiplexers 36a, 36b, 36c, and 36d of the first embodiment) which select third data items whose phases are different from those of the first data items and second data items, one by one at different timings from data items that is output from two of the 2M flip-flops during the period in which the FFE enable signal is at "1" level; and 2M third switches (which are equivalent to the switches 44a, 44b, 44c, and 44d) which output a third series of data items that is output from the 2M second multiplexers during time period when the levels of the switching signals SW[2M−1:0] that is output from the AND gates are "1" levels.

Figure 5:
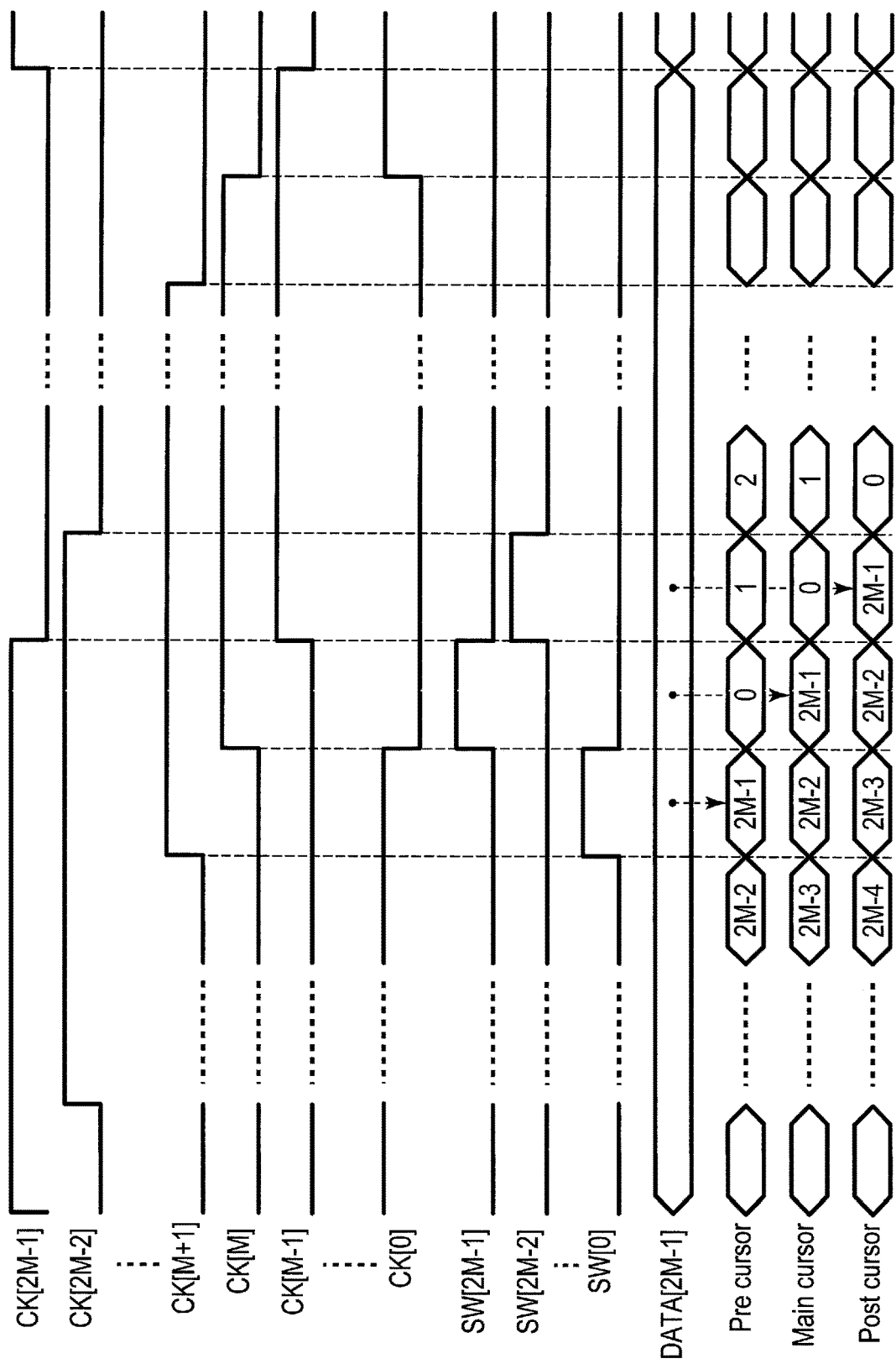
FIG. 5 is a chart showing an example of signal waveforms of an M-to-1 MUX circuit in the second embodiment.

FIG. 5 shows an example of signal waveforms of the 2M-to-1 MUX circuit 52.

The phases of the clock signals CK[2M−1], CK[2M−2], . . . CK[0] are different from one another. The shift in phase corresponds to 2M equal parts of one cycle.

A switching signal SW[0] output from the AND gate supplied with the clock signals CK[0] and CK[M+1] is at "1" level during the period in which the clock signals CK[0] and CK[M+1] are both at "1" level.

A switching signal SW[2M−1] output from the AND gate supplied with the clock signals CK[2M−1] and CK[M] is at "1" level during the period in which the clock signals CK[2M−1] and CK[M] are both at "1" level.

A switching signal SW[2M−2] output from the AND gate supplied with the clock signals CK[2M−2] and CK[M−1] is at "1" level during the period in which the clock signals CK[2M−2] and CK[M−1] are both at "1" level.

Using these three switching signals SW[0], SW[2M−1], and SW[2M−2], the data selected by the switching signal SW[0], the data selected by the switching signal SW[2M−1], and the data selected by the switching signal SW[2M−2] can be generated as the pre-cursor, the main cursor, and post cursor, respectively, for example, in the vicinity of one cycle of transmission data D[2M−1] output in one cycle from the flip-flops, as in the first embodiment.

In the second embodiment, too, the 2M-to-1 MUX circuit 52 selects part of the stored transmission data in response to the three switching signals whose phases are shifted to output the main cursor, post cursor, and pre-cursor. The three switching signals have only to be contiguous and their timing can be set optionally.

In the example of FIG. 5, the switching signals SW[0], SW[2M−1], and SW[2M−2] are used; however, they can be replaced with other continuous three signals with different timing.

If 2M is large, the number of switching signals is not limited to three, but four or more data items can be selected near the center of one cycle of transmission data D[2M−1] that is output in one cycle using a larger number of switching signals to generate a plurality of pre-cursors and a plurality of post cursors.

The foregoing embodiment is directed to an example of the transmission device employing NRZ modulation, but 4-value switching amplitude modulation (also referred to as PAM-4) may be employed. In the case of the PAM-4, two bits of a most significant bit (MSB) and a least significant bit (LSB) are transmitted as one symbol and thus the number of signal lines to the driver is twice as large as that in the transmission device according to the embodiments described above. It is therefore unnecessary to provide a data generation circuit alone, which brings about a great advantage that power consumption can be reduced by generating data for an FFE by the MUX circuit in PAM-4 system.

The above embodiments are not limited to the descriptions themselves. When the invention is reduced to practice, its structural elements can be modified in different ways and embodied without departing from the spirit of the invention. Furthermore, a variety of inventions can be made by appropriate combinations of the structural elements of the embodiments. For example, some of the structural elements of the embodiments can be omitted. Moreover, the structural elements of different embodiments can be combined appropriately.

What is claimed is:

1. A data generation circuit comprising:
a storing circuit configured to store different data items and output the data items in different phases in response to clock signals whose phases are shifted;
a first selection circuit configured to select first data items one by one at different timings from the data items output from the storing circuit and output a first series of selected first data items; and
a second selection circuit configured to select second data items one by one, whose phase are different from the selected first data items, at different timings from the data items output from the storing circuit and output a second series of selected second data items.

2. The data generation circuit of claim 1, wherein the storing circuit is configured to store values of bits of parallel data in a cycle of each of the clock signals.

3. The data generation circuit of claim 2, wherein the storing circuit comprises a plurality of flip-flops configured to store the values of the bits of the parallel data and output the stored values of the bits of the parallel data in different phases in response to the clock signals.

4. The data generation circuit of claim 3, further comprising:
a first logic circuit configured to generate switching signals in response to pairs of the clock signals whose phases are adjacent among the clock signals,
wherein
the first selection circuit comprises a plurality of first switches configured to sequentially select one of the values of the bits of the parallel data output from the flip-flops in response to the switching signals; and
wherein
the second selection circuit comprises:
a second logic circuit configured to receive pairs of values of bits output from the flip-flops whose phases are adjacent, and select one of the values of the bits included in the pairs of the bits output from the flip-flops, a phase of the one of the bits being delayed than another of the values of the bits; and
second switches configured to sequentially select one of the values of the bits outputs from the second logic circuit in response to the switching signals.

5. The data generation circuit of claim 4, wherein:
a selection control signal can be supplied to the second logic circuit;
the second logic circuit is configured to select one of the values of the bits included in the pairs output from the flip-flops, a phase of the one being delayed than another of the values of the bits included in the pairs in a case where the selection control signal is supplied; and
the second logic circuit is configured to select one of the values of the bits included in the pairs output from the flip-flops, a phase of the one being advanced than another of the values of the bits included in the pairs in a case where the selection control signal is not supplied.

6. The data generation circuit of claim 1, wherein the data items comprise at least four bits.

7. The data generation circuit of claim 1, wherein:
the clock signals comprise:
a first clock signal,
a second clock signal whose phase is delayed by 90 degrees than a phase of the first clock signal;
a third clock signal whose phase is delayed by 90 degrees than the phase of the second clock signal; and
a fourth clock signal whose phase is delayed by 90 degrees than the phase of the third clock signal,
the data generation circuit comprises:
a first AND gate configured to receive the first clock signal and the second clock signal;
a second AND gate configured to receive the second clock signal and the third clock signal;
a third AND gate configured to receive the third clock signal and the fourth clock signal; and
a fourth AND gate configured to receive the fourth clock signal and the first clock signal;
the storing circuit comprises:
a first flip-flop configured to store first data and output the stored first data in synchronization with the first clock signal;
a second flip-flop configured to store second data and output the stored second data in synchronization with the second clock signal;
a third flip-flop configured to store third data and output the stored third data in synchronization with the third clock signal; and
a fourth flip-flop configured to store fourth data and output the stored fourth data in synchronization with the fourth clock signal;
the first selection circuit comprises:
a first switch configured to pass the first data output from the first flip-flop in response to an output from the first AND gate;
a second switch configured to pass the second data output from the second flip-flop in response to an output from the second AND gate;
a third switch configured to pass the third data output from the third flip-flop in response to an output from the third AND gate;
a fourth switch configured to pass the fourth data output from the fourth flip-flop in response to an output from the fourth AND gate;
the second selection circuit comprises:
a first multiplexer configured to receive the first data output from the first flip-flop and the fourth data output from the fourth flip-flop and output one of the first data and the fourth data;
a second multiplexer configured to receive the second data output from the second flip-flop and the first data output from the first flip-flop and output one of the second data and the first data;
a third multiplexer configured to receive the third data output from the third flip-flop and the second data output from the second flip-flop and output one of the third data and the second data;
a fourth multiplexer configured to receive the fourth data output from the fourth flip-flop and the third data output from the third flip-flop and output one of the fourth data and the third data;
a fifth switch configured to pass data output from the first multiplexer in response to an output from the first AND gate;
a sixth switch configured to pass data output from the second multiplexer in response to an output from the second AND gate;
a seventh switch configured to pass data output from the third multiplexer in response to an output from the third AND gate;
an eighth switch configured to pass data output from the fourth multiplexer in response to an output from the fourth AND gate.

8. The data generation circuit of claim 7, wherein:
a selection control signal can be supplied to the first multiplexor, the second multiplexor, the third multiplexor, and the fourth multiplexor;
the first multiplexor is configured to output the fourth data when the selection control signal is supplied and output the first data when the selection control signal is not supplied;
the second multiplexor is configured to output the first data when the selection control signal is supplied and output the second data when the selection control signal is not supplied;
the third multiplexor is configured to output the second data when the selection control signal is supplied and output the third data when the selection control signal is not supplied; and
the fourth multiplexor is configured to output the third data when the selection control signal is supplied and output the fourth data when the selection control signal is not supplied.

9. The data generation circuit of claim 1, wherein:
the second selection circuit is configured to select third data items one by one as the second data items at different timings from the data items output from the storing circuit, phases of the third data items respectively being delayed than phases of the first data items selected by the first selection circuit, and output a third series of selected second data items; and
the second selection circuit is configured to select fourth data items one by one as the second data items at different timings from the data items output from the storing circuit, phases of the fourth data items respectively being advanced than phases of the first data items selected by the first selection circuit, and output a fourth series of selected second data items.

10. A transmission device comprising:
a storing circuit configured to store different data items and output the data items in different phases in response to clock signals whose phases are shifted;
a first selection circuit configured to select first data items one by one at different timings from the data items output from the storing circuit and output a first series of selected first data items;
a second selection circuit configured to select second data items one by one, whose phase are different from the selected first data items, at different timings from the data items output from the storing circuit and output a second series of selected second data items; and
a transmitter configured to receive the first series of data from the first selection circuit and the second series of data from the second selection circuit, correct the first series of data based on the second series of data, and output a corrected first series of data to a transmission path.

11. The transmission device of claim 10, wherein the storing circuit is configured to store values of bits of parallel data in a cycle of each of the clock signals.

12. The transmission device of claim 11, wherein the storing circuit comprises a plurality of flip-flops configured to store the values of the bits of the parallel data and output the stored values of the bits of the parallel data in different phases in response to the clock signals.

13. The transmission device of claim 12, further comprising:
a first logic circuit configured to generate switching signals in response to pairs of the clock signals whose phases are adjacent among the clock signals,
wherein
the first selection circuit comprises a plurality of first switches configured to sequentially select one of the values of the bits of the parallel data output from the flip-flops in response to the switching signals; and
wherein
the second selection circuit comprises:
a second logic circuit configured to receive pairs of values of bits output from the flip-flops whose phases are adjacent, and select one of the values of the bits included in the pairs output from the flip-flops, a phase of the one of the bits being delayed than another of the values of the bits; and
second switches configured to sequentially select one of the values of the bits outputs from the second logic circuit in response to the switching signals.

14. The transmission device of claim 13, wherein:
a selection control signal can be supplied to the second logic circuit;

the second logic circuit is configured to select one of the values of the bits included in the pairs output from the flip-flops, a phase of the one being delayed than another of the values of the bits included in the pairs in a case where the selection control signal is supplied; and
the second logic circuit is configured to select one of the values of the bits included in the pairs output from the flip-flops, a phase of the one being advanced than another of the values of the bits included in the pairs in a case where the selection control signal is not supplied.

15. The transmission device of claim 10, wherein the data items comprise at least four bits.

16. The transmission device of claim 10, wherein:
the clock signals comprise:
a first clock signal,
a second clock signal whose phase is delayed by 90 degrees than a phase of the first clock signal;
a third clock signal whose phase is delayed by 90 degrees than the phase of the second clock signal; and
a fourth clock signal whose phase is delayed by 90 degrees than the phase of the third clock signal,
the data generation circuit comprises:
a first AND gate configured to receive the first clock signal and the second clock signal;
a second AND gate configured to receive the second clock signal and the third clock signal;
a third AND gate configured to receive the third clock signal and the fourth clock signal; and
a fourth AND gate configured to receive the fourth clock signal and the first clock signal;
the storing circuit comprises:
a first flip-flop configured to store first data and output the stored first data in synchronization with the first clock signal;
a second flip-flop configured to store second data and output the stored second data in synchronization with the second clock signal;
a third flip-flop configured to store third data and output the stored third data in synchronization with the third clock signal; and
a fourth flip-flop configured to store fourth data and output the stored fourth data in synchronization with the fourth clock signal;
the first selection circuit comprises:
a first switch configured to pass the first data output from the first flip-flop in response to an output from the first AND gate;
a second switch configured to pass the second data output from the second flip-flop in response to an output from the second AND gate;
a third switch configured to pass the third data output from the third flip-flop in response to an output from the third AND gate;
a fourth switch configured to pass the fourth data output from the fourth flip-flop in response to an output from the fourth AND gate;
the second selection circuit comprises:
a first multiplexer configured to receive the first data output from the first flip-flop and the fourth data output from the fourth flip-flop and output one of the first data and the fourth data;
a second multiplexer configured to receive the second data output from the second flip-flop and the first data output from the first flip-flop and output one of the second data and the first data;

a third multiplexer configured to receive the third data output from the third flip-flop and the second data output from the second flip-flop and output one of the third data and the second data;

a fourth multiplexer configured to receive the fourth data output from the fourth flip-flop and the third data output from the third flip-flop and output one of the fourth data and the third data;

a fifth switch configured to pass data output from the first multiplexer in response to an output from the first AND gate;

a sixth switch configured to pass data output from the second multiplexer in response to an output from the second AND gate;

a seventh switch configured to pass data output from the third multiplexer in response to an output from the third AND gate;

an eighth switch configured to pass data output from the fourth multiplexer in response to an output from the fourth AND gate.

17. The transmission device of claim 16, wherein:

a selection control signal can be supplied to the first multiplexor, the second multiplexor, the third multiplexor, and the fourth multiplexor;

the first multiplexor is configured to output the fourth data when the selection control signal is supplied and output the first data when the selection control signal is not supplied;

the second multiplexor is configured to output the first data when the selection control signal is supplied and output the second data when the selection control signal is not supplied;

the third multiplexor is configured to output the second data when the selection control signal is supplied and output the third data when the selection control signal is not supplied;

the fourth multiplexor is configured to output the third data when the selection control signal is supplied and output the fourth data when the selection control signal is not supplied.

18. The transmission device of claim 10, wherein:

the second selection circuit is configured to select third data items one by one as the second data items at different timings from the data items output from the storing circuit, phases of the third data items respectively being delayed than phases of the first data items selected by the first selection circuit, and output a third series of selected second data items;

the second selection circuit is configured to select fourth data items one by one as the second data items at different timings from the data items output from the storing circuit, phases of the fourth data items respectively being advanced than phases of the first data items selected by the first selection circuit, and output a fourth series of selected second data items; and the transmitter is configured to correct the first series of data based on the third series of data and the fourth series of data and output the corrected first series of data to the transmission path.

* * * * *